United States Patent
Kawahara et al.

(10) Patent No.: US 7,777,288 B2
(45) Date of Patent: Aug. 17, 2010

(54) INTEGRATED CIRCUIT DEVICE AND FABRICATION METHOD THEREFOR

(75) Inventors: Naoyoshi Kawahara, Kanagawa (JP); Hiroshi Murase, Kanagawa (JP); Hiroaki Ohkubo, Kanagawa (JP); Kuniko Kikuta, Kanagawa (JP); Yasutaka Nakashiba, Kanagawa (JP); Naoki Oda, Tokyo (JP); Tokuhito Sasaki, Tokyo (JP); Nobukazu Ito, Tokyo (JP)

(73) Assignees: NEC Electronics Corporation, Kawasaki, Kanagawa (JP); NEC Corporation, Tokyo (JP)

( * ) Notice: Subject to any disclaimer, the term of this patent is extended or adjusted under 35 U.S.C. 154(b) by 263 days.

(21) Appl. No.: 11/052,215

(22) Filed: Feb. 8, 2005

(65) Prior Publication Data

US 2005/0173775 A1    Aug. 11, 2005

(30) Foreign Application Priority Data

Feb. 9, 2004    (JP)    ............... 2004-032660

(51) Int. Cl.
*H01L 31/058* (2006.01)
(52) U.S. Cl. ............. 257/437; 257/536; 257/758
(58) Field of Classification Search ......... 257/467–470, 257/536–537, 758
See application file for complete search history.

(56) References Cited

U.S. PATENT DOCUMENTS

| | | | | |
|---|---|---|---|---|
| 3,942,075 | A | * | 3/1976 | Maran et al. ................ 361/106 |
| 6,441,420 | B1 | | 8/2002 | Nagano et al. |
| 6,841,843 | B2 | * | 1/2005 | Ohkubo et al. .............. 257/467 |
| 6,876,067 | B2 | * | 4/2005 | Arai et al. .................... 257/666 |
| 2003/0222281 | A1 | | 12/2003 | Arai et al. |
| 2005/0072213 | A1 | * | 4/2005 | Besnard et al. ............ 73/31.06 |
| 2005/0161822 | A1 | * | 7/2005 | Ohkubo et al. .............. 257/758 |
| 2005/0221573 | A1 | * | 10/2005 | Kawahara et al. .......... 438/386 |
| 2005/0269512 | A1 | * | 12/2005 | Ohkubo et al. ........... 250/338.1 |

FOREIGN PATENT DOCUMENTS

| | | | |
|---|---|---|---|
| JP | 01-199462 | | 8/1989 |
| JP | 1-302849 | | 12/1989 |
| JP | 02-090646 | | 3/1990 |
| JP | 06-069207 | | 3/1994 |
| JP | 07-235577 | | 9/1995 |
| JP | 08-083823 | * | 3/1997 |
| JP | 9-229778 | | 9/1997 |
| JP | 08-308321 | * | 6/1998 |
| JP | 10-150153 A | | 6/1998 |

OTHER PUBLICATIONS

Chinese Office Action dated Nov. 9, 2007 with English translation.
Japanese Office Action mailed Apr. 6, 2010 with partial English language translation.

* cited by examiner

*Primary Examiner*—Ori Nadav
(74) *Attorney, Agent, or Firm*—McGinn IP Law Group PLLC (57) ABSTRACT

In a temperature sensor section of a semiconductor integrated circuit device, wires of the topmost wiring layer of a multi-layer wiring structure are formed. A sheet-like temperature monitor element of vanadium oxide is provided between two of the wires in such a way as to cover the two wires. Accordingly, the temperature monitor element is connected between the two wires of an underlying wiring layer of the multi-layer wiring structure through two vias and the two wires of the topmost wiring layer.

21 Claims, 10 Drawing Sheets

INTEGRATED CIRCUIT DEVICE AND FABRICATION METHOD THEREFOR

BACKGROUND OF THE INVENTION

1. Field of the Invention

The present invention relates to an integrated circuit device with a built-in monolithic temperature sensor and a method of fabricating the same. More particularly, the present invention relates to a semiconductor integrated circuit device having a temperature sensor fabricated in a semiconductor process.

2. Description of the Related Art

Recently, the need for monitoring the operation temperature of an integrated circuit device is growing for the purpose of preventing thermal breakdown of devices in the integrated circuit device and stabilizing the operation of a device having a temperature-dependent characteristic, such as a crystal oscillator, among those devices which are provided in the integrated circuit device.

In this respect, Japanese Patent Laid-Open Publication No. Hei 01-302849, for example, discloses a technique of protecting an LSI (Large Scale Integrated circuit) in a semiconductor integrated circuit device from thermally broken by a temperature rise by providing a temperature sensor on the same substrate as that of the LSI, deciding that the LSI is abnormally overheated when the temperature detected by the temperature sensor exceeds a predetermined value and then shutting down the LSI.

Figure 1:
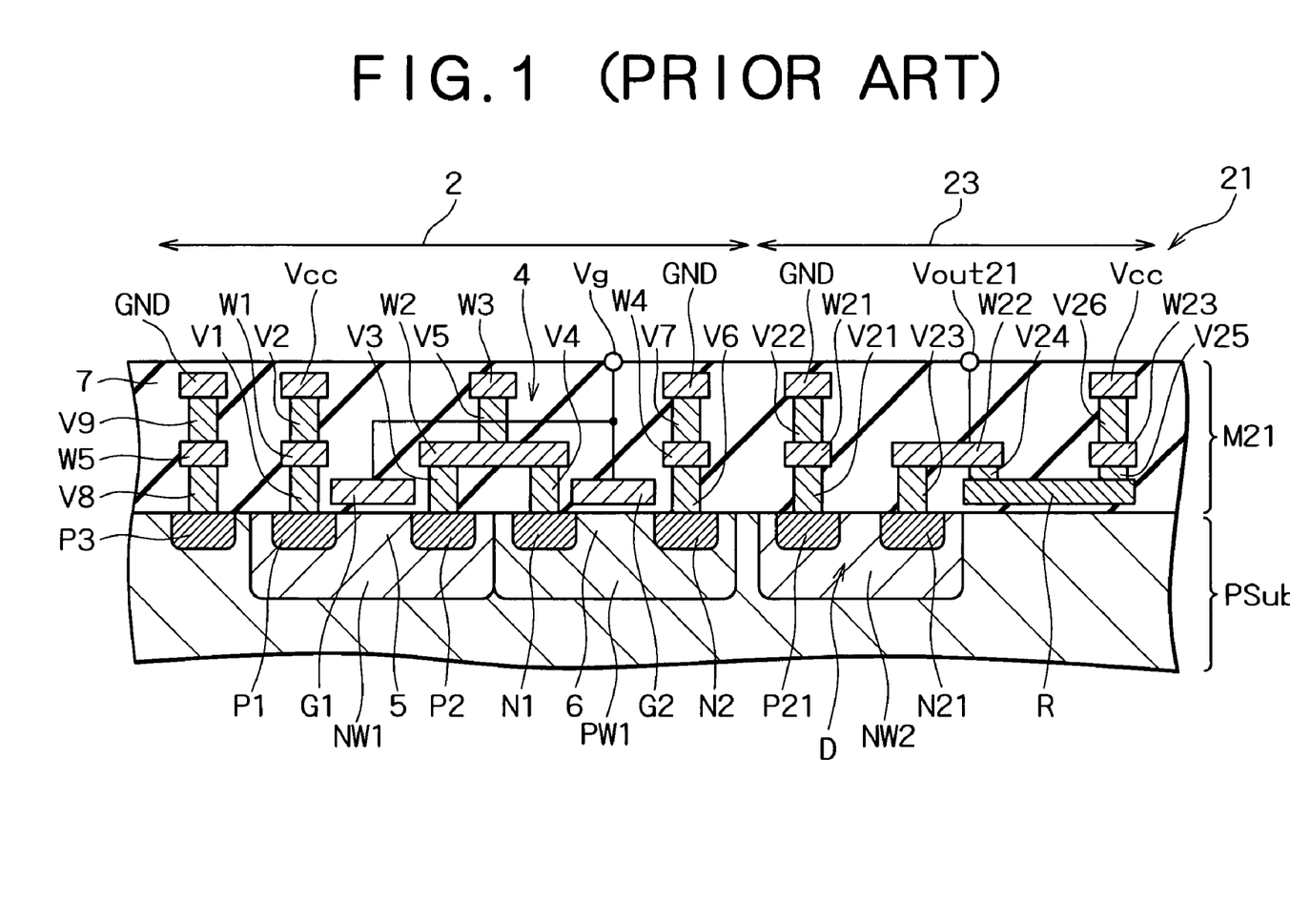
FIG. 1 is a cross-sectional view showing a conventional semiconductor integrated circuit device having the temperature sensor.
Figure 2:
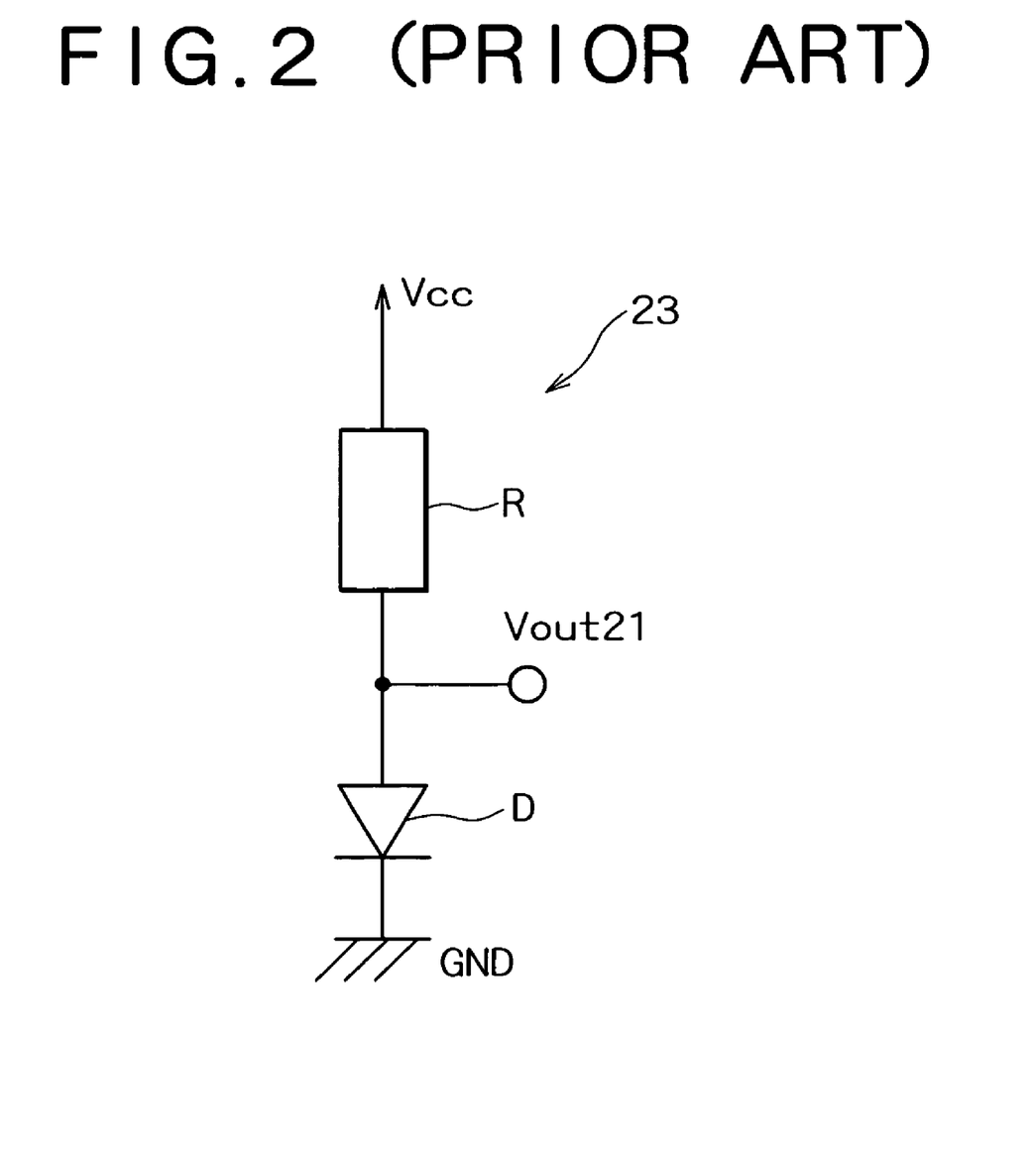
FIG. 2 is an equivalent circuit diagram showing the temperature sensor section of the semiconductor integrated circuit device shown in FIG. 1.

A technique of using a parasitic pn junction diode as such a temperature sensor is proposed in, for example, Japanese Patent Laid-Open Publication No. Hei 09-229778. FIG. 1 is a cross-sectional view showing a conventional semiconductor integrated circuit device having the temperature sensor described in Japanese Patent Laid-Open Publication No. Hei 09-229778, and FIG. 2 is an equivalent circuit diagram showing the temperature sensor section of the semiconductor integrated circuit device as shown in FIG. 1.

As shown in FIG. 1, this conventional semiconductor integrated circuit device 21 includes a P type silicon substrate PSub and a multi-layer wiring structure M21 formed on the P type silicon substrate PSub. The multi-layer wiring structure M21 is the lamination of plural wiring layers and plural insulating layers alternately laminated. The semiconductor integrated circuit device 21 is provided with a logic circuit section 2, which is formed at the top surface of the P type silicon substrate PSub and a predetermined region of the multi-layer wiring structure M21, and a temperature sensor section 23, which is formed at the top surface of the P type silicon substrate PSub and that region of the multi-layer wiring structure M21 where the logic circuit section 2 is not formed.

A CMOS (Complementary Metal Oxide Semiconductor) circuit 4, for example, is provided in the logic circuit section 2. In the CMOS circuit 4, an N well NW1 and a P well PW1 are formed at the top surface of the P type silicon substrate PSub in such a way as to be adjacent to each other. Two $p^+$ diffusion regions P1 and P2, which becomes a source/drain region, are formed, apart from each other, at the top surface of the N well NW1. Two $n^+$ diffusion regions N1 and N2, which becomes the source/drain region, are formed, apart from each other, at the top surface of the P well PW1. There are a channel region 5 between the $p^+$ diffusion regions P1 and P2 in the N well NW1 and a channel region 6 between the $n^+$ diffusion regions N1 and N2 in the P well PW1.

A gate insulating layer (not shown) is provided at that region in the multi-layer wiring structure M21 which includes regions directly overlying the channel regions 5 and 6, and gate electrodes G1 and G2 of, for example, polysilicon, are respectively provided at the regions directly overlying the channel regions 5 and 6. The gate electrodes G1 and G2 are commonly connected to a gate terminal Vg. The channel region 5, the $p^+$ diffusion regions P1 and P2 as the source/drain region, the gate insulating layer and the gate electrode G1 form a P type MOS transistor. The channel region 6, the $n^+$ diffusion regions N1 and N2 as the source/drain region, the gate insulating layer and the gate electrode G2 form an N type MOS transistor.

A via V1 is provided on the $p^+$ diffusion region P1 in the multi-layer wiring structure M21 in such a way as to be connected to the $p^+$ diffusion region P1, and a wire W1 is provided on the via V1 in such a way as to be connected to the via V1. A via V2 is provided on the wire W1 in such a way as to be connected to the wire W1, and a power-source potential wire Vcc is provided on the via V2 in such a way as to be connected to the via V2. Accordingly, the $p^+$ diffusion region P1 is connected to the power-source potential wire Vcc through the via V1, the wire W1 and the via V2.

A via V3 is provided on the $p^+$ diffusion region P2 in the multi-layer wiring structure M21 in such a way as to be connected to the $p^+$ diffusion region P2, and a via V4 is provided on the $n^+$ diffusion region N1 in such a way as to be connected to the $n^+$ diffusion region N1. A wire W2 is provided on the vias V3 and V4 in such a way as to be connected to the vias V3 and V4. A via V5 is provided on the wire W2 in such a way as to be connected to the wire W2, and a wire W3 is provided on the via V5 in such a way as to be connected to the via V5. Accordingly, the $p^+$ diffusion region P2 and the $n^+$ diffusion region N1 are connected to the wire W3 through the vias V3 and V4, the wire W2 and the via V5.

Further, a via V6 is provided on the $n^+$ diffusion region N2 in the multi-layer wiring structure M21 in such a way as to be connected to the $n^+$ diffusion region N2, and a wire W4 is provided on the via V6 in such a way as to be connected to the via V6. A via V7 is provided on the wire W4 in such a way as to be connected to the wire W4, and a ground potential wire GND is provided on the via V7 in such a way as to be connected to the via V7. Accordingly, the $n^+$ diffusion region N2 is connected to the ground potential wire GND through the via V6, the wire W4 and the via V7.

A $p^+$ diffusion region P3 is formed at that region of the top surface of the P type silicon substrate PSub which is other than the region where the N well NW1 and the P well PW1 are formed. A via V8, a wire W5, a via V9 and a ground potential wire GND are provided on the $p^+$ diffusion region P3 in the multi-layer wiring structure M21 in order in the bottom-to-top direction, and the $p^+$ diffusion region P3 is connected to the ground potential wire GND through the via V8, the wire W5 and the via V9.

In the temperature sensor section 23, an N well NW2 is formed at the top surface of the P type silicon substrate PSub, and a $p^+$ diffusion region P21 and an $n^+$ diffusion region N21 are formed apart from each other at the top surface of the N well NW2. A via V21, a wire W21, a via V22 and a ground potential wire GND are provided on the $p^+$ diffusion region P21 in the multi-layer wiring structure M21 in order in the bottom-to-top direction, and the $p^+$ diffusion region P21 is connected to the ground potential wire GND through the via V21, the wire W21 and the via V22.

A via V23 is provided on the $n^+$ diffusion region N21 in the multi-layer wiring structure M21 in such a way as to be connected to the $n^+$ diffusion region N21, and a wire W22 is provided on the via V23. The wire W22 is connected to the via V23 at one end, and is connected to an output terminal Vout 21. A via V24 is provided under the wire W22 in such a way as to be connected to the other end of the wire W22, and a resistor R of, for example, polysilicon is provided under the via V24. The resistor R has a sheet shape whose one end is connected to the via V24. The resistor R is formed at the same time as the gate electrodes G1 and G2 of the CMOS circuit 4 and is provided at the same level as the gate electrodes G1 and G2.

A via V25 is provided on the resistor R in such a way as to be connected to the other end of the resistor R. A wire W23, wire W23, a via V26 and a power-source potential wire Vcc are provided on the via V25 in order in the bottom-to-top direction, and the resistor R is connected to the power-source potential wire Vcc through the via V25, the wire W23 and the via V26.

Accordingly, a potential higher than the potential to be applied to the $p^+$ diffusion region P21 is applied to the N well NW2. Consequently, forward pn junction is formed between the $p^+$ diffusion region P21 and the N well NW2, thereby forming a parasitic pn junction diode D.

In the multi-layer wiring structure M21, the vias V1, V3, V4, V6, V8, V21 and V23 are provided in a first insulating layer in which the gate electrodes G1 and G2 and the resistor R are provided at the same level. The wires W1, W2, W4, W5, W21, W22 and W23 are provided at the same level in a first wiring layer provided on the first insulating layer, and the vias V2, V5, V7, V9, V22 and V26 are provided in a second insulating layer provided on the first wiring layer. Further, the individual ground potential wires GND, the individual power-source potential wires Vcc, and the wire W3 are provided at the same level in a second wiring layer provided on the second insulating layer. Those portions of the multi-layer wiring structure M21 which exclude the individual vias, the individual wires, the gate electrodes G1 and G2, and the resistor R, and the layer overlying the second insulating layer are buried with an insulation material 7.

In the temperature sensor section 23 of the semiconductor integrated circuit device 21, as shown in FIG. 2, the resistor R and the parasitic pn junction diode D are connected in series in this order from the power-source potential wire Vcc toward the ground potential wire GND, and the output terminal Vout 21 is connected to the node between the resistor R and the parasitic pn junction diode D. The parasitic pn junction diode D is connected in the forward direction.

With the structure, as shown in FIG. 1, when the temperature of the semiconductor integrated circuit device 21 changes, the characteristic of the parasitic pn junction diode D changes, which changes the potential of the output terminal Vout 21. The temperature of the semiconductor integrated circuit device 21 can be measured by detecting the potential of the output terminal Vout 21. Because the parasitic pn junction diode D can be formed in the semiconductor integrated circuit device 21 by using the device structure of an MOS transistor, the temperature sensor section 23 can be formed without changing the conventional MOS process.

The prior art however has the following problem. According to the prior art shown in FIGS. 1 and 2, as the temperature coefficient of the parasitic pn junction diode D is as low as 0.002/K or so, a sufficient SNR (Signal-to-Noise Ratio) cannot be acquired.

SUMMARY OF THE INVENTION

It is an object of the present invention to provide an integrated circuit device having a temperature sensor capable of providing a sufficient SNR, and a method of fabricating the same.

An integrated circuit device according to the first aspect of the present invention comprises: a substrate; a multi-layer wiring structure provided on the substrate, the multi-layer wiring structure having a plurality of wiring layers, each of which has wires and an insulation layer; and a temperature monitor element which is made of a metal oxide and is in contact with two wires of a topmost wiring layer of the multi-layer wiring structure so as to be connected between the two wires.

According to the present invention, the temperature monitor element is connected between two wires of the topmost wiring layer of the multi-layer wiring structure. As the resistivity of the metal oxide forming the temperature monitor element changes according to the temperature, the temperature can be measured by measuring the resistance between the wires. As the temperature coefficient of the resistivity of the metal oxide is higher and more stable than the temperature coefficient of the resistivity of the pn junction, temperature measurement with a high SNR can be achieved. Because the temperature monitor element is connected directly to the two wires of the topmost wiring layer of the multi-layer wiring structure, the fabrication process is simple.

The temperature monitor element may have a shape of a sheet and may be provided in such a way as to cover at least a portion of each of the two wires, and the metal oxide of the temperature monitor element may be not provided on other wires except the two wires of the topmost wiring layer of the multi-layer wiring structure. This can ensure microfabrication of wires except the two wires.

The temperature monitor element may have a shape of a sheet and be provided in such a way as to cover at least a portion of each of the two wires, and the metal oxide of the temperature monitor element is also provided on other wires of the topmost wiring layer of the multi-layer wiring structure. This facilitates etching of the metal oxide layer.

The metal oxide may be vanadium oxide ($VO_x$), and the wires may be formed of one metal selected from a group of Al, Ti, Cu, Ta and W, or an alloy of the metal, or an alloy containing at least two metals in the group.

According to the second aspect of the present invention, there is provided a method of fabricating an integrated circuit device having a substrate and a multi-layer wiring structure provided on the substrate. The multi-layer wiring structure has a plurality of wiring layers, each of which has wires and an insulation layer. The fabrication method comprises the steps of: forming a plurality of wiring layer except a topmost wiring layer of the multi-layer wiring structure on the substrate; forming wires of the topmost wiring layer of the multi-layer wiring structure; and forming a temperature monitor element of a metal oxide in such a way as to be in contact with two of the wires of the topmost wiring layer and be connected between the two wires.

Because the temperature monitor element is formed in such a way as to be in contact with the two wires of the topmost wiring layer of the multi-layer wiring structure, it is unnecessary to form plugs or the like for connection of the temperature monitor element to the two wires, thereby simplifying the fabrication process for an integrated circuit device.

It is preferable that the forming of the temperature monitor element should include the steps of: depositing the metal oxide layer on a wiring layer of the multi-layer wiring structure which is under the topmost wiring layer; and patterning the metal oxide layer by selectively etching out the metal oxide layer so as to form the temperature monitor element which connects the two wires of the topmost wiring layer.

At the patterning of the metal oxide layer, the metal oxide layer is removed from an area above the wires except the two wires of the topmost wiring layer. In this case, it is preferable that dry etching should be carried out using a fluorine-containing gas as the etching. This can achieve a high etching ratio with respect to the wires.

Or, at the patterning of the metal oxide layer, the metal oxide layer remains in such a way as to cover the wires except the two wires. Accordingly, the wires are not exposed at the time of etching, thereby reducing the restrictions on the etching condition.

According to the present invention, the provision of the temperature monitor element of a metal oxide can realize an integrated circuit device with a high-SNR temperature sensor. In addition, as the temperature monitor element is formed in such a way as to be connected directly to the two wires of the topmost wiring layer of the multi-layer wiring structure, the fabrication process for an integrated circuit device can be simplified.

DETAILED DESCRIPTION OF THE PREFERRED EMBODIMENTS

Figure 3:
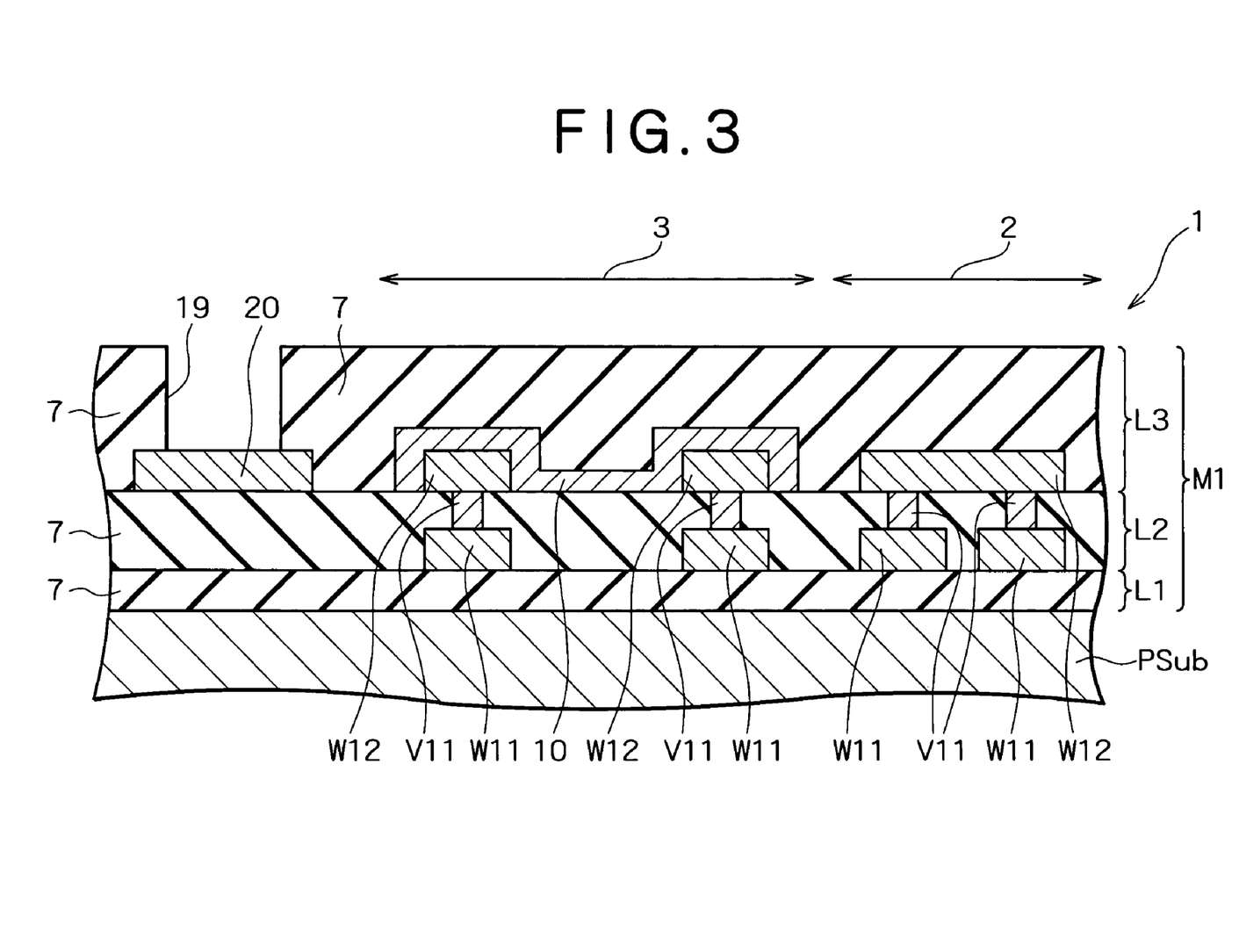
FIG. 3 is a cross-sectional view showing a semiconductor integrated circuit device according to a first embodiment of the present invention.
Figure 4:
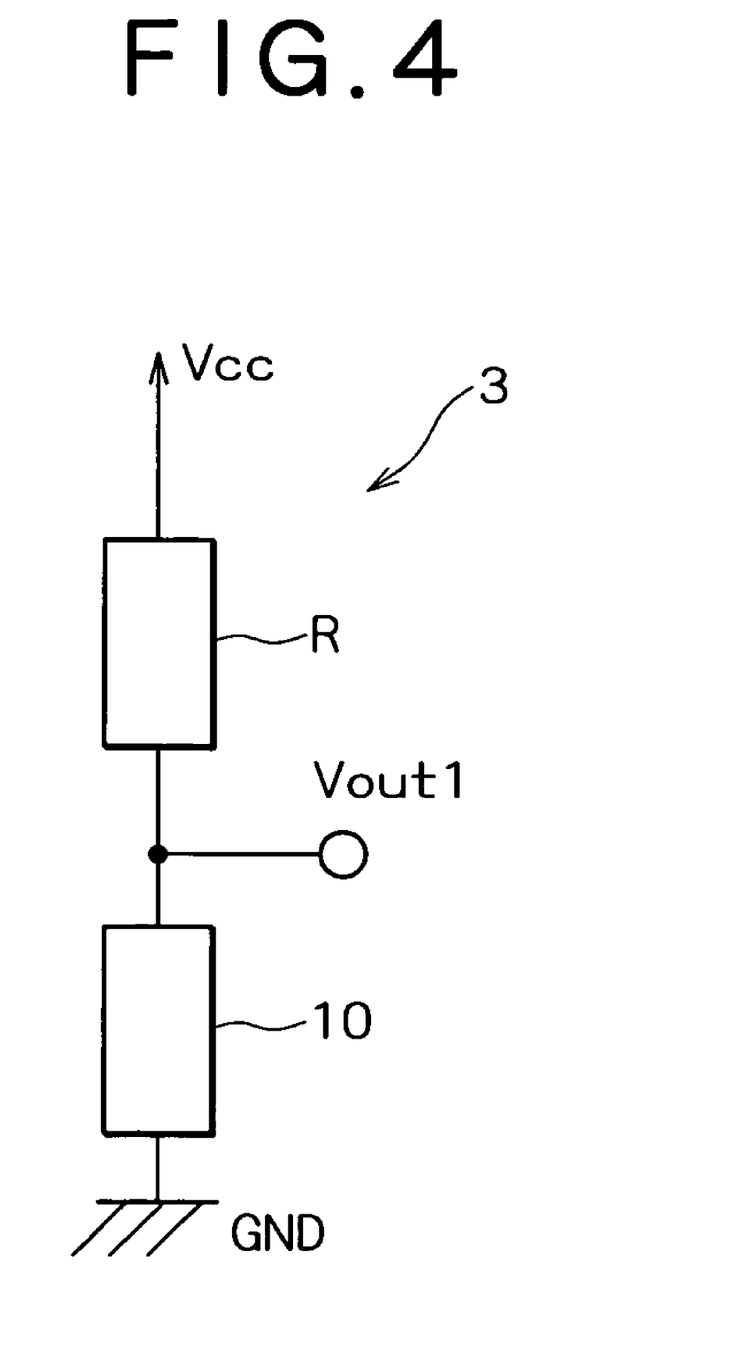
FIG. 4 is an equivalent circuit diagram showing the temperature sensor section of the semiconductor integrated circuit device shown in FIG. 3.

Preferred embodiments of the present invention will be described specifically below with reference to the accompanying drawings. To begin with, the first embodiment of the present invention will be discussed. FIG. 3 is a cross-sectional view showing a semiconductor integrated circuit device according to a first embodiment of the invention, and FIG. 4 is an equivalent circuit diagram showing the temperature sensor section of the semiconductor integrated circuit device shown in FIG. 3. The semiconductor integrated circuit device according to the present embodiment is formed on a single silicon chip. As shown in FIG. 3, the semiconductor integrated circuit device 1 according to the embodiment is provided with a logic circuit section 2 and a temperature sensor section 3, and an external pad 20 which connects the internal circuit of the semiconductor integrated circuit device 1 to an external device is provided at a part of the region excluding the logic circuit section 2 and the temperature sensor section 3. The following will describe the structure that is common to the entire semiconductor integrated circuit device 1.

The semiconductor integrated circuit device 1 is provided with a P type silicon substrate PSub on which a multi-layer wiring structure M1 is provided. The multi-layer wiring structure M1 is the lamination of, for example, three wiring layers L1 to L3 laminated in order from the substrate side. Each of the wiring layers has a plurality of wires, a plurality of vias and a insulating film which buries the wires and vias. Wires W11 of, for example, aluminum (Al) are provided at the wiring layer L2, and vias V11 of, for example, tungsten (W) are provided as a plug on the wires W11. The wires W11 and vias V11 consist the wiring layer L2. Wires W12 of, for example, Al are provided at the wiring layer L3. The wires W12 consist the wiring layer L3. The wiring layer L3 is the topmost wiring layer of the multi-layer wiring structure M1. And, the wires W12 are the topmost wire of the multi-layer wiring structure M1. The wire W11, the via V11 and the wire W12 are connected in series in the named order. Vias (not shown) which connect the wires W11 to diffusion regions (not shown) formed at the top surface of the P type silicon substrate Psub are provided at the wiring layer L1. The portion of the multi-layer wiring structure M1 which excludes the wires and the vias is buried with an insulation material 7, such as a silicon oxide.

The structures of the individual sections of the semiconductor integrated circuit device 1 will be described now. In the temperature sensor section 3, as mentioned above, at least two wires W11 and two wires W12 are provided at the wiring layers L2 and L3 of the multi-layer wiring structure M1, respectively, and the vias V11 are provided between the wires W11 and W12. Accordingly, two sets of conductive structures each having the wire W11, the via V11, and the wire W12 connected in series in the named order are provided in the multi-layer wiring structure M1. A temperature monitor element 10 of a vanadium oxide is provided at the wiring layer L3 in such a way as to cover the top and side surfaces of the two wires W12. The temperature monitor element 10 is in direct contact with the two wires W12, so that the temperature monitor element 10 is connected between the two wires W12.

The shape of the temperature monitor element 10 is a square sheet for example, in a planar view, and the length of one side of the square is, for example, 10 to 20 μm, with a thickness of, for example, 0.1 to 0.2 μm. Stable compound of a vanadium oxide are, for example, $VO_2$ and $V_2O_5$ or so, and x in the chemical formula, $VO_x$, for the vanadium oxide is around "2". The volume resistivity of the vanadium oxide when the temperature is 25° C. is, for example, 0.01 to 10 (Ω·cm) or so on the silicon wafer, and the temperature coefficient is about −0.02 to −0.03 (/K). The resistance of the temperature monitor element 10 is, for example, several hundred Ω, e.g., 300 Ω.

As the temperature sensor section 3 is constructed in the above-described manner, one of the two wires W11 is connected to one end of the temperature monitor element 10 through one via V11 and one wire W12, while the other one of the two wires W11 is connected to the other end of the temperature monitor element 10 through the other via V11 and the other wire W12. That is, the temperature monitor element 10 is connected between two wires 11.

For example, one of the wires W11 is connected to a ground potential wire GND (see FIG. 4), while the other wire W11 is connected to a power-source potential wire Vcc (see FIG. 4) through a resistor R (see FIG. 4) and an output terminal Vout1 (see FIG. 4) is connected to the node between the temperature monitor element 10 and the resistor R. The structure of the resistor R and the layout position in the multi-layer wiring structure M1 are, for example, the same as the resistor R of the conventional semiconductor integrated circuit device 21 shown in FIG. 1. That is, the resistor R in the embodiment is formed by, for example, a polysilicon film, and its resistance is set nearly equal to the resistance of, for example, the temperature monitor element 10 and is, for example, several hundred Ω, e.g., 300Ω.

The logic circuit section 2, like the logic circuit section 2 of the conventional semiconductor integrated circuit device 21 (see FIG. 1), performs processes, such as arithmetic operations and storage, and has devices such as a CMOS circuit. The logic circuit section may include a circuit which performs data processing on the results of measurements done by the temperature sensor section 3. Only the wires W11 and W12 and the vias 11 are shown in the logic circuit section 2 in FIG. 3 and the illustration of the other structural elements is omitted to simplify the diagram.

An opening 19 is formed in the insulation layer of the wiring layer L3 of the multi-layer wiring structure M1 at a part of the region of the semiconductor integrated circuit device 1 which excludes the logic circuit section 2 and the temperature sensor section 3. An external pad 20 is provided at the bottom of the opening 19. The external pad 20 is formed of, for example, Al, and is formed by patterning the same Al layer as is used for the wire W12. Therefore, the height of the external pad 20 from the P type silicon substrate PSub and the thickness of the pad 20 are the same as those of the wire W12. As mentioned earlier, the external pad 20 serves to connect the semiconductor integrated circuit device 1 to an external device.

At the region of the semiconductor integrated circuit device 1 which is other than the temperature sensor section 3, e.g., at the logic circuit section 2, a layer of vanadium oxide is not formed on the wires W12. Likewise, a layer of vanadium oxide is not formed on the external pad 20 which is formed at the same level as the wires W12.

As the semiconductor integrated circuit device 1 according to the present embodiment is constructed in the above-described manner, a circuit having the resistor R and the temperature monitor element 10 connected in series in the named order from the power-source potential wire Vcc toward the ground potential wire GND is formed in the temperature sensor section 3 as shown in FIG. 4. The output terminal Vout1 is connected to the node between the resistor R and the temperature monitor element 10.

The operation of the semiconductor integrated circuit device 1 according to the present embodiment with the above-described structure will be discussed below. When the ground potential is applied to the ground potential wire GND and the power-source potential is applied to the power-source potential wire Vcc, as shown in FIG. 4, the potential of the output terminal Vout1 takes a value between the ground potential and the power-source potential, which is determined by the resistance of the temperature monitor element 10 and the resistance of the resistor R. When the temperature of the semiconductor integrated circuit device 1 rises due to the outside temperature rises or due to the heat generated by the logic circuit section driven, the temperature of the temperature monitor element 10 rises too, so that its resistance decreases. Because the temperature coefficient of the resistivity of the vanadium oxide forming the temperature monitor element 10 is −0.02 to −0.03 or so at this time, the resistance decreases 2 to 3% or so, as the temperature rises by 1° C. Then, the temperature of the semiconductor integrated circuit device 1 is measured by detecting the potential of the output terminal Vout1.

The effects of the present embodiment will be discussed next. As the absolute value of the temperature coefficient of the resistivity of a vanadium oxide is 0.02 to 0.03 or so, which is greater than the absolute value of the parasitic pn junction diode, 0.002, a high SNR can be acquired at the time of measuring the temperature. As the vanadium oxide is chemically stable, the reliability of the temperature sensor section 3 can be improved. This results in an improvement of the reliability of the semiconductor integrated circuit device 1. Because a layer of vanadium oxide is not formed on the wires W12 and the external pad 20 which are formed at the other region than the temperature sensor section 3 in the embodiment, the intervals between the wires W12 can be made very narrow at the other region than the temperature sensor section 3.

Although the foregoing description of the embodiment describes the wires W11 and W12 formed of Al as an example, the present invention is not limited to this mode, but the wires W11 and W12 may be formed of, for example, an Al alloy, or any one of titanium (Ti), copper (Cu), tantalum (Ta) and W, or an alloy of any of those metals, or may be formed by a multi-layer film having layers of those metals or alloys laminated. The wires W11 and W12 may be formed of, for example, a three-layer film comprised of a TiN layer, an AlCu alloy layer and a TiN layer.

The temperature sensor sections 3 may be formed at one location of a chip where the semiconductor integrated circuit device 1 is formed, or may be formed at plural locations of the chip respectively. For example, the temperature sensor sections 3 may be formed at the center portion and four corners of the chip, i.e., at a total of five locations. As the temperature sensor sections 3 are respectively provided at plural locations and the average value of the measurements of the individual temperature sensor sections 3 is computed, the accuracy of the temperature measurement can be improved further.

Figure 5:
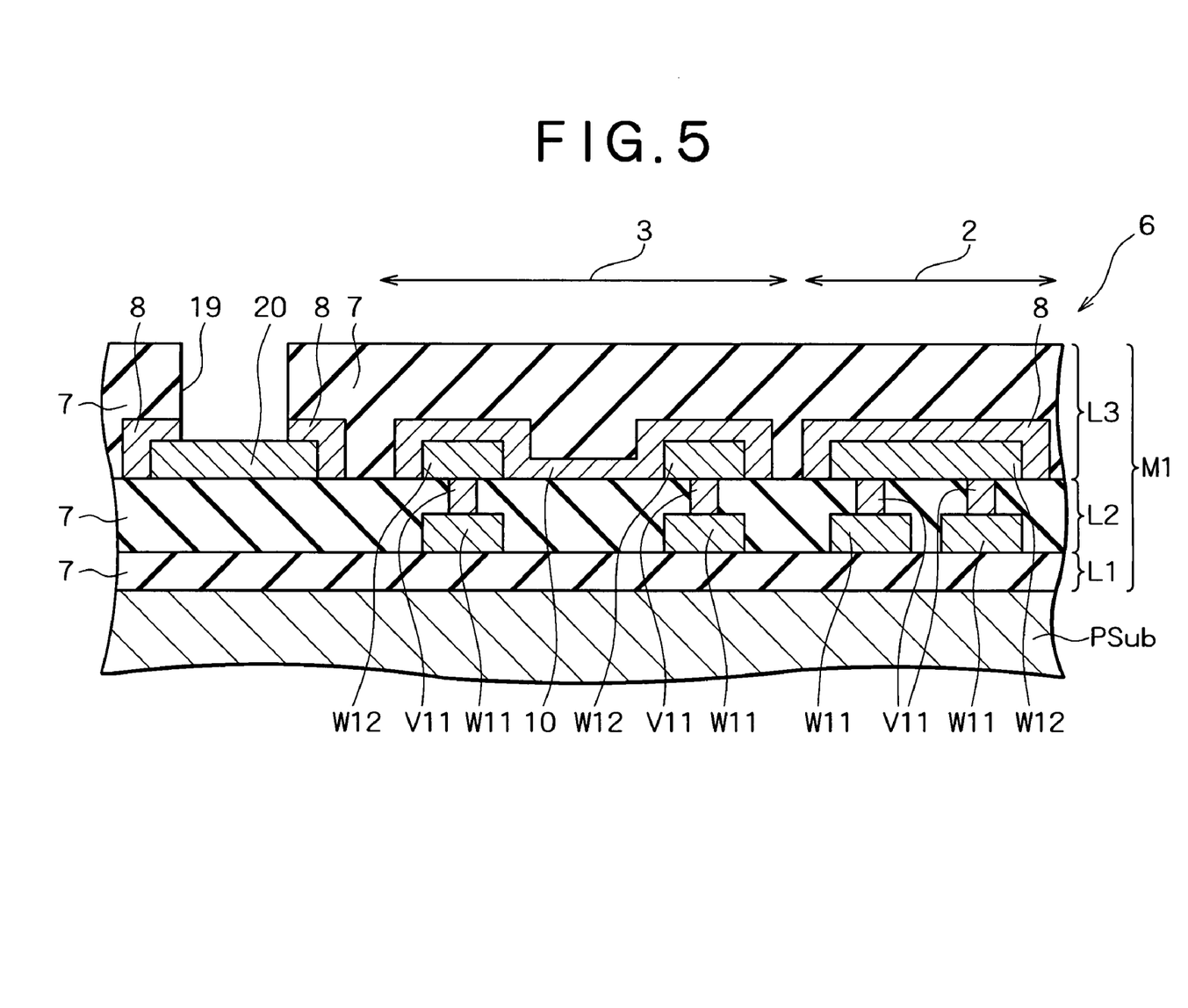
FIG. 5 is a cross-sectional view showing a semiconductor integrated circuit device according to a second embodiment of the present invention.

The second embodiment of the present invention will be discussed below. FIG. 5 is a cross-sectional view showing a semiconductor integrated circuit device according to the present embodiment. As shown in FIG. 5, in the present embodiment, a vanadium oxide layer 8 is also provided at the region of a semiconductor integrated circuit device 6 which is other than the temperature sensor section 3, e.g., at the logic circuit section 2, in such a way as to cover the top and side surfaces of the wires W12. The top and side surfaces of the periphery of the external pad 20 are likewise covered with the vanadium oxide layer 8.

The opening 19 is formed in such a way as to penetrate the vanadium oxide layer 8 and reach the external pad 20. Therefore, the top center portion of the external pad 20 is not covered with the vanadium oxide layer 8, and is exposed at the bottom of the opening 19. The vanadium oxide layer 8 is provided at the same level and with the same thickness as the temperature monitor element 10. The other structure of the present embodiment is the same as that of the first embodiment.

Figure 6:
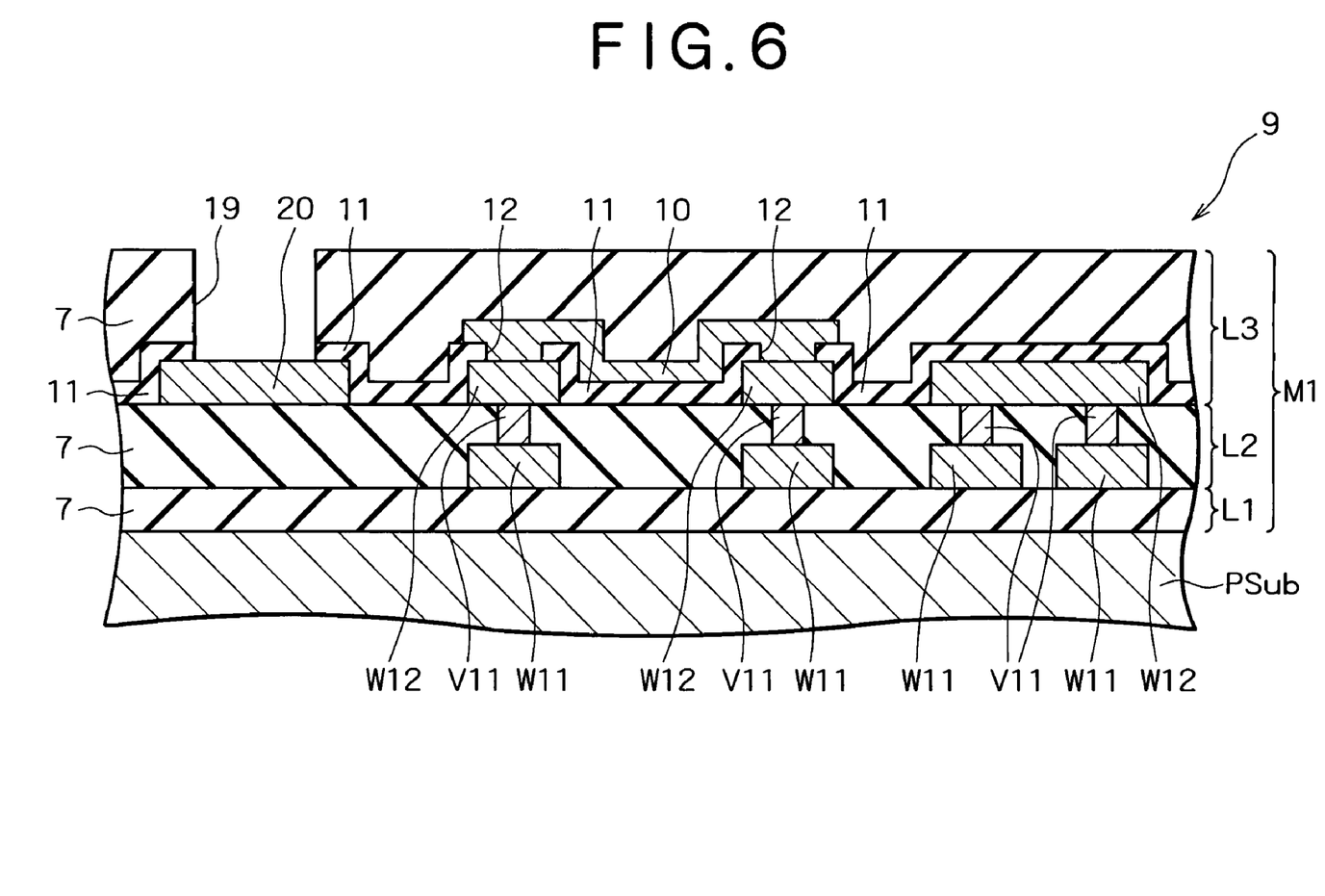
FIG. 6 is a cross-sectional view showing a semiconductor integrated circuit device according to a third embodiment of the present invention.

The third embodiment of the present invention will be discussed below. FIG. 6 is a cross-sectional view showing a semiconductor integrated circuit device according to the present embodiment. As shown in FIG. 6, in the present embodiment, an insulating layer 11 is provided at the wiring layer L3 in a semiconductor integrated circuit device 9 in such a way as to cover the wires W12. Vias 12 are formed at a part of the region of the insulating layer 11 which directly lies above the wires W12 in the temperature sensor section 3. A part of the temperature monitor element 10 is buried in the vias 12. Accordingly, the temperature monitor element 10 is connected to the wires W12 in the vias 12.

The opening 19 is formed in such a way as to penetrate the insulating layer 11 and reach the external pad 20. Therefore, the top center portion of the external pad 20 is not covered with the insulating layer 11, and is exposed at the bottom of the opening 19. The other structure of the embodiment is the same as that of the first embodiment.

Figure 7:
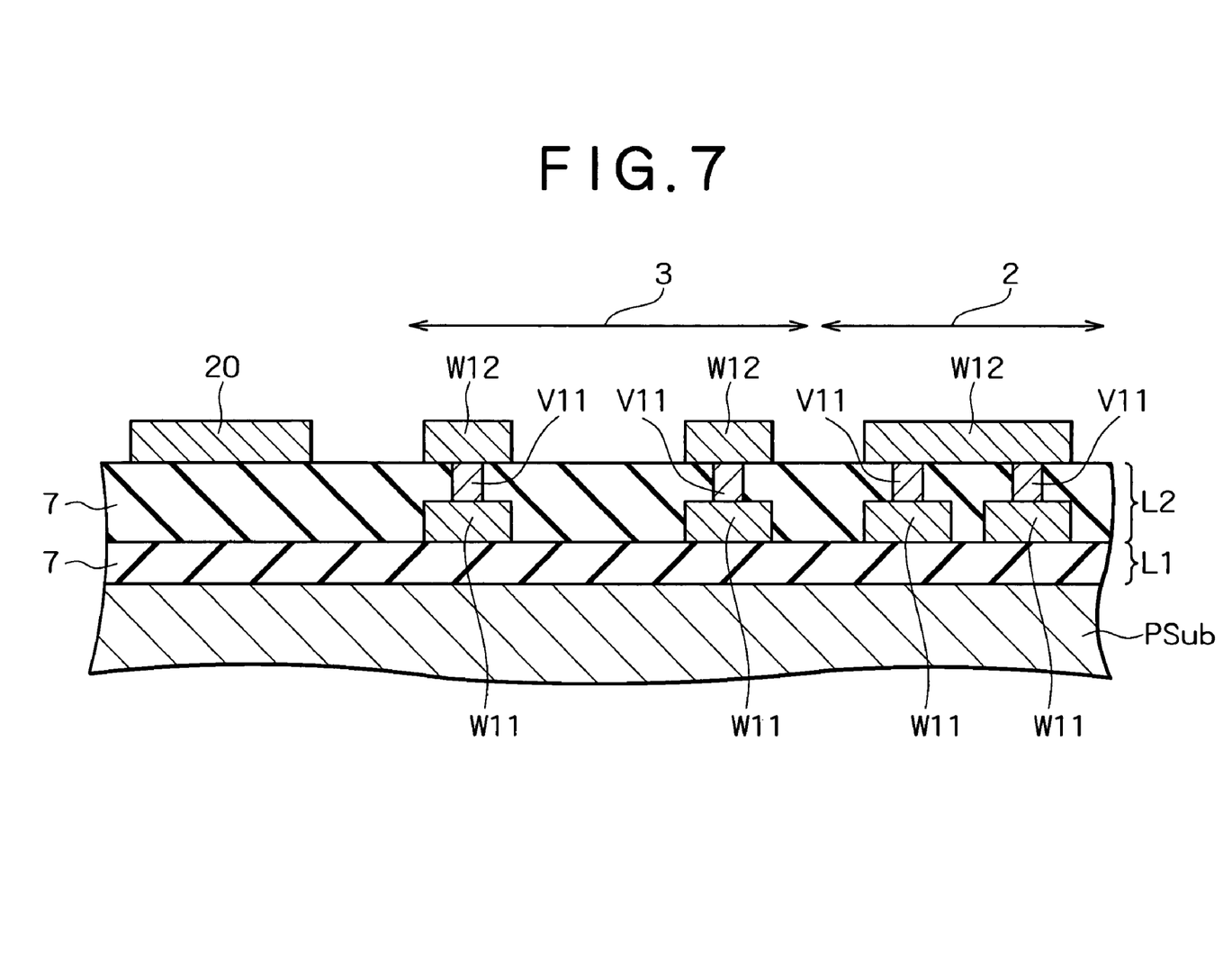
FIG. 7 is a cross-sectional view illustrating a fabrication method for the semiconductor integrated circuit device according to a fourth embodiment of the present invention.
Figure 8:
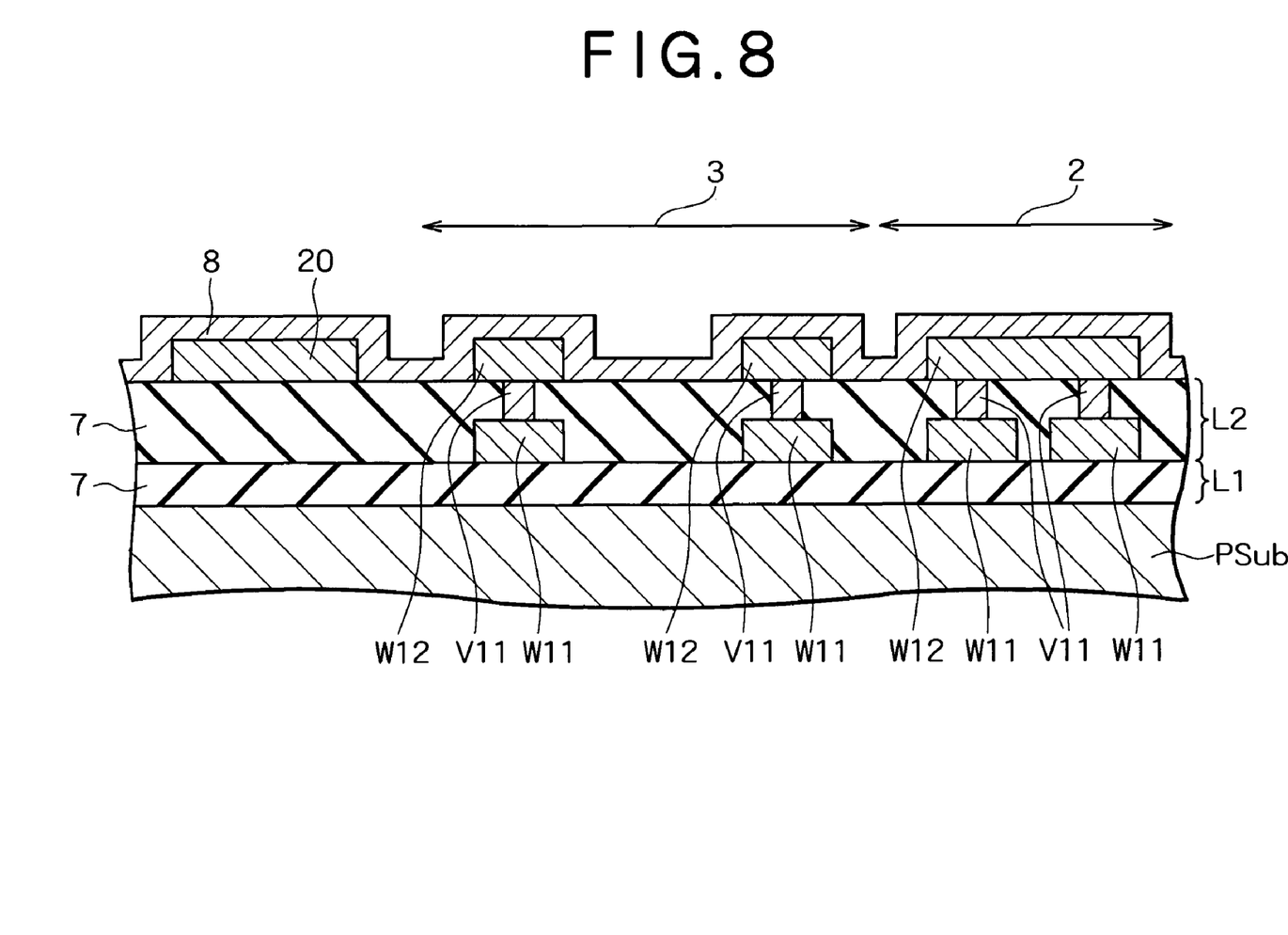
FIG. 8 is a cross-sectional view illustrating the fabrication method for the semiconductor integrated circuit device according to the fourth embodiment and showing the next step to the step in FIG. 7.
Figure 9:
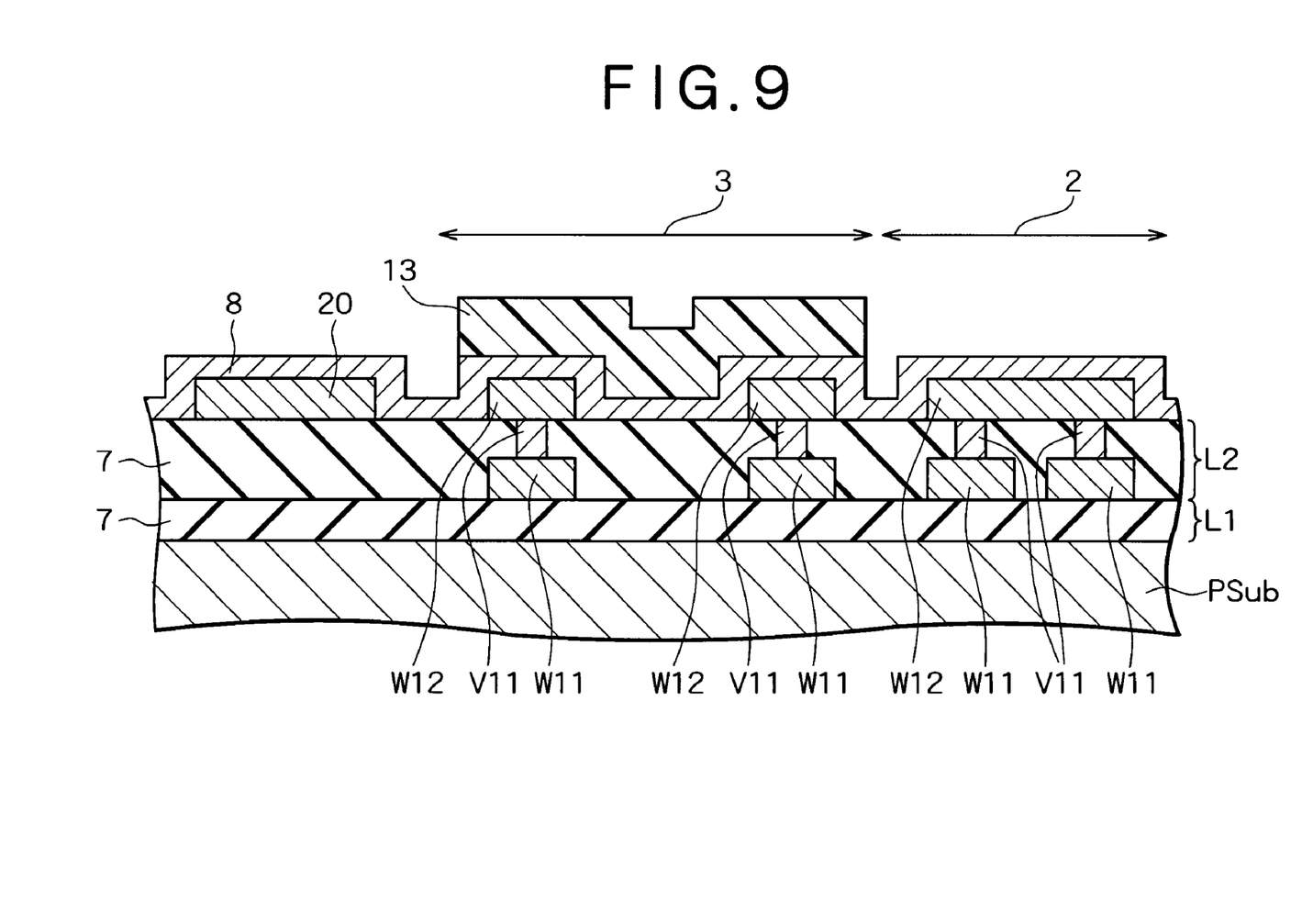
FIG. 9 is a cross-sectional view illustrating the fabrication method for the semiconductor integrated circuit device according to the fourth embodiment and showing the next step to the step in FIG. 8.

The fourth embodiment of the present invention will be discussed below. The present embodiment is concerned with a fabrication method for the semiconductor integrated circuit device according to the first embodiment. FIGS. 7 through 9 are cross-sectional views illustrating a fabrication method for the semiconductor integrated circuit device according to the present embodiment step by step.

First, as shown in FIG. 7, a diffusion region (not shown) is formed at a predetermined region at the top surface of the P type silicon substrate PSub, and then the wiring layer L1 is formed on the P type silicon substrate PSub. Vias (not shown) which are connected to the diffusion region and the gate electrode (not shown) of a MOS transistor or so are formed at the wiring layer L1.

Next, the wires W11 are formed of, for example, Al on the wiring layer L1, the wires W11 are buried with the insulation material 7, and the vias V11 of, for example, W are formed in such a way as to connect to the wires W11. This forms the wiring layer L2. Next, the wires W12 and the external pad 20 are formed of, for example, Al on the wiring layer L2. The external pad 20 is formed at the region of the semiconductor integrated circuit device 1 which excludes the logic circuit section 2 and the temperature sensor section 3.

Next, as shown in FIG. 8, the vanadium oxide layer 8 of a vanadium oxide is deposited on the entire surface of the wiring layer L2 in such a way as to cover the wires W12 and the external pad 20. The vanadium oxide is deposited by a reactive sputtering which is carried out by using vanadium as the target under the oxygen-containing atmosphere, and then the vanadium oxide layer 8 is formed through a reduction process of the vanadium oxide by a heat treatment. The thickness of the vanadium oxide layer 8 is, for example, 0.1 to 0.2 μm. At this time, the vanadium oxide layer 8 is directly deposited on the wires W12.

Then, as shown in FIG. 9, a resist 13 is formed on the vanadium oxide layer 8 in such a way as to cover a predetermined region in the temperature sensor section 3. The predetermined region is a region reserved for the provision of the temperature monitor element 10 (see FIG. 3) in a subsequent step, and is a square region which has a side of, for example, 10 to 20 μm and includes a part of the two wires W12. With the resist 13 as a mask, dry etching is performed. In this case, an etching condition selected is that a vanadium oxide is selectively etched while hardly etching Al. For example, etching is carried out using a fluorine-containing etching gas, such as a $CF_4$ gas or an $SF_6$ gas. Then, the resist 13 is removed.

Accordingly, the vanadium oxide layer 8 remains at the region covered with the resist 13 (see FIG. 9), but is removed from the other region. As a result, the vanadium oxide layer 8 is selectively removed and patterned to form the temperature monitor element 10 in the temperature sensor section 3.

Next, the temperature monitor element 10, the wires W12 and the external pad 20 are buried with the insulation material 7. Then, the opening 19 is formed in a part of the region of the layer of the insulation material 7 which lies directly above the external pad 20 in such a way as to reach the external pad 20. Consequently, the wiring layer L3 is formed and the multi-layer wiring structure M1 is formed. Accordingly, the semiconductor integrated circuit device 1 according to the first embodiment is prepared.

According to the present embodiment, the temperature monitor element 10 is formed in the wiring layer L3 which is the topmost wiring layer of the multi-layer wiring structure M1 in such a way as to be directly in contact with the wires W12. It is therefore unnecessary to form plugs or the like for connection of the temperature monitor element 10 to the wires W12 and unnecessary to form a special layer for the layout of the temperature monitor element 10 above the multi-layer wiring structure M1. This can allow the semiconductor integrated circuit device 1 with the temperature sensor section 3 to be fabricated in a simple process.

According to the present embodiment, as the temperature monitor element 10 is provided above the wires W12 of the wiring layer L3 which is the topmost wiring layer of the multi-layer wiring structure M1, the components of the semiconductor integrated circuit device 1 from the P type silicon substrate PSub up to the wires W12 can be formed in the conventional fabrication process. This can suppress an increase in manufacture cost which is originated from the provision of the temperature monitor element 10. In addition, the portion from the P type silicon substrate PSub to the wires W12 is not contaminated by the vanadium oxide, thus preventing contamination of the semiconductor manufacture equipment which fabricates that portion.

Figure 10:
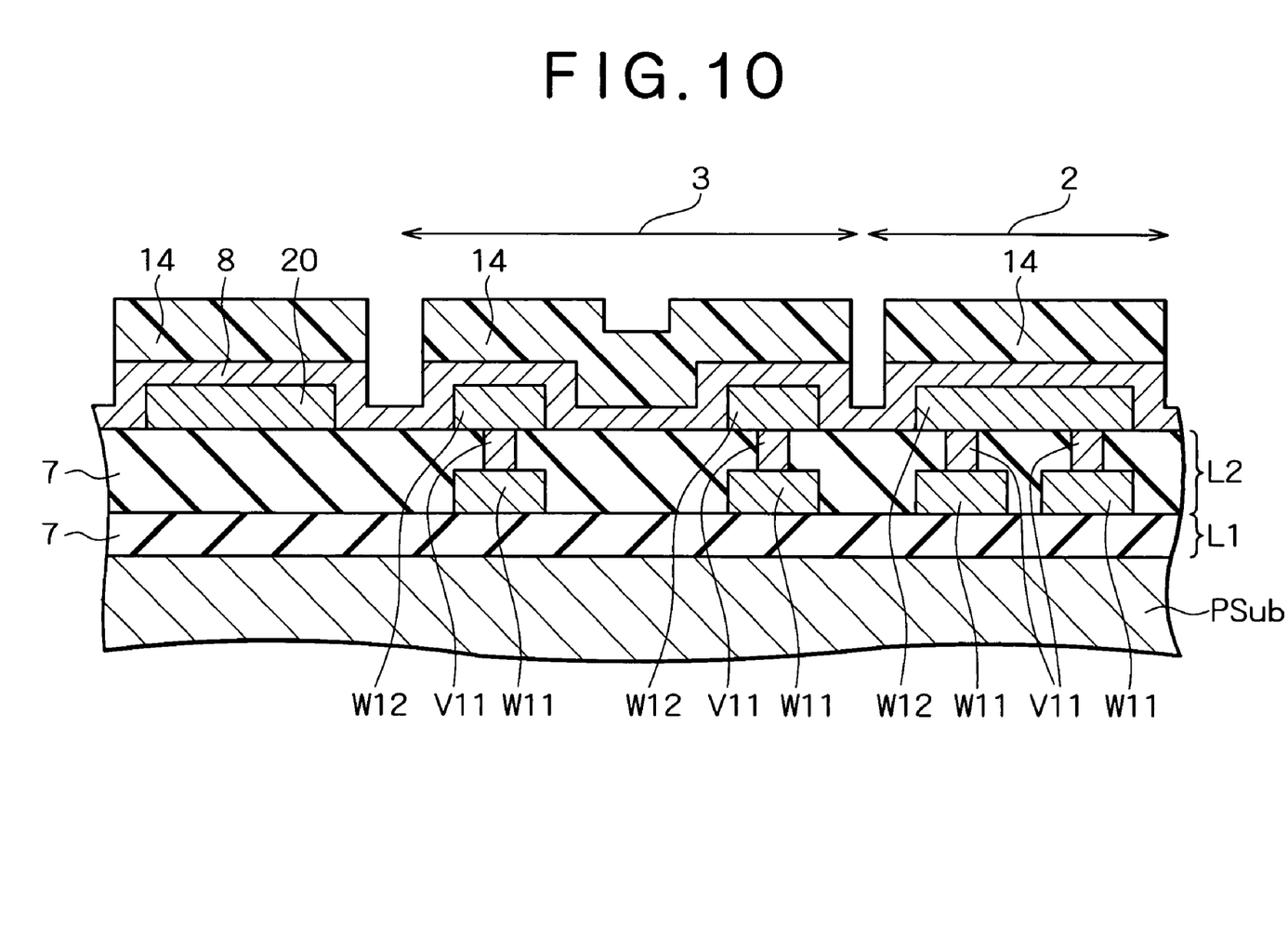
FIG. 10 is a cross-sectional view illustrating a fabrication method for the semiconductor integrated circuit device according to a fifth embodiment of the invention.

The fifth embodiment of the present invention will be discussed below. The present embodiment is concerned with a fabrication method for the semiconductor integrated circuit device according to the second embodiment. FIG. 10 is a cross-sectional view illustrating a fabrication method for the semiconductor integrated circuit device according to the present embodiment.

First, as shown in FIGS. 7 and 8, the wiring layers L1 and L2 are formed on the P type silicon substrate PSub, the wires W12 are formed on the wiring layer L2, and the vanadium oxide layer 8 is deposited in such a way as to cover the wires W12 by a method similar to the method of the fourth embodiment.

Next, as shown in FIG. 10, a resist 14 is formed on the vanadium oxide layer 8. The resist 14 is formed in such a way as to cover the region of the temperature sensor section 3 which includes a region reserved for the provision of the temperature monitor element 10 (see FIG. 5) and a region directly lying above the wires W12 and the external pad 20 at the region of the semiconductor integrated circuit device 1 exclude the temperature sensor section 3. With the resist 14 as a mask, dry etching of the vanadium oxide layer 8 is carried out. The etching condition at this time is not particularly limited, but any condition can be selected as long as a vanadium oxide is selectively etched while hardly etching the insulation material 7. Accordingly, the vanadium oxide layer 8 is selectively removed from that region which excludes the region covered with the resist 14, and is patterned. Consequently, the temperature monitor element 10 is formed in the temperature sensor section 3. The vanadium oxide layer 8 remains even at the other region than the temperature sensor section 3 in such a way as to cover the top and side surfaces of the wires W12 and the external pad 20.

Next, as shown in FIG. 5, the temperature monitor element 10, the wires W12 and the external pad 20 are buried with the insulation material 7. Then, the opening 19 is formed in a part of the region of the layer of the insulation material 7 and the vanadium oxide layer 8 which lies directly above the external pad 20 in such a way as to reach the external pad 20. Consequently, the wiring layer L3 is formed and the multi-layer wiring structure M1 is formed. Accordingly, the semiconductor integrated circuit device 6 according to the second embodiment is prepared.

According to the present embodiment, it is unnecessary to consider the etching ratio between the vanadium oxide layer 8 and the wires W12 of Al at the time of etching the vanadium oxide layer 8, so that the restrictions on the etching condition are less than those of the fourth embodiment, thus providing a greater degree of freedom of the fabrication process. The other effects of the present embodiment as discussed above are the same as those of the fourth embodiment.

The sixth embodiment of the present invention will be discussed below. The present embodiment is concerned with a fabrication method for the semiconductor integrated circuit device according to the third embodiment. As shown in FIG. 7, the wiring layers L1 and L2 are formed on the P type silicon substrate PSub, and the wires W12 and the external pad 20 are formed on the wiring layer L2, by a method similar to the method of the fourth embodiment.

Next, as shown in FIG. 6, the insulating layer 11 is deposited in such a way as to cover the wires W12 and the external pad 20. The vias 12 are formed in a part of the insulating layer 11 which lies directly above the wires W12. Then, the vanadium oxide layer 8 is deposited on the insulating layer 11 by a method similar to the method of the fourth embodiment. At this time, the vanadium oxide layer 8 is also buried in the vias 12 in the insulating layer 11.

The vanadium oxide layer 8 is patterned to form the temperature monitor element 10 by a method similar to the method of the fourth embodiment. Next, the insulating layer 11 and the temperature monitor element 10 are buried with the insulation material 7, and the opening 19 is formed in a region lying directly above the external pad 20. At this time, the opening 19 is formed in such a way as to penetrate through the insulating layer 11. Through the process, the semiconductor integrated circuit device 9 according to the third embodiment is prepared. The other structure and effects of the present embodiment as discussed above are the same as those of the fourth embodiment.

What is claimed is:

1. An integrated circuit device comprising:
   a substrate;
   a multi-layer wiring structure provided on said substrate, said multi-layer wiring structure having a plurality of wiring layer structures, each wiring layer structure having wires and an insulation layer, and
   a single layer temperature monitor element which comprises a metal oxide,
   wherein said substrate and said multilayer wiring structure form a temperature sensor section and a logic circuit section,
   wherein in said temperature sensor section at least two wires of said wires are formed in an uppermost wiring layer structure of said plurality of wiring layer structure and in said logic circuit section at least one wire of said wires is formed in said uppermost wiring layer structure, and
   wherein said single layer temperature monitor element directly contacts said at least two wires formed in said uppermost wiring layer of said temperature sensor section,
   wherein said single layer temperature monitor element completely covers said at least two wires,
   wherein one of said at least two wires is connected to a ground potential wire and another of said at least two wires is connected to a power-source potential wire via a resistor,
   wherein an output terminal is connected between said single layer temperature monitor element and said resistor, and
   wherein a mechanism is provided for detecting a potential of said output terminal by applying a ground potential to said ground wire and a power-source potential to said power-source potential wire.

2. The integrated circuit device according to claim 1, wherein said single layer temperature monitor element has a shape of a sheet and is provided in such a way as to cover at least a portion of each of said at least two wires formed in said uppermost wiring layer structure of said temperature sensor section.

3. The integrated circuit device according to claim 2, wherein said metal oxide of said single layer temperature monitor element is not provided on other wires except said at least two wires formed in said uppermost wiring layer structure of said temperature sensor section.

4. The integrated circuit device according to claim 1, further comprising:
   an insulating layer provided in said uppermost wiring layer structure so as to cover said wires of said uppermost wiring layer structure of said multi-layer wiring structure; and
   two vias formed at the region of said insulating layer which directly overlies said two wires in such a way as to reach said two wires, respectively, with a part of said single layer temperature monitor element being buried in said two vias.

5. The integrated circuit device according to claim 1, wherein said metal oxide comprises vanadium oxide.

6. The integrated circuit device according to claim 1, wherein said wires are formed of one metal selected from a group of Al, Ti, Cu, Ta and W, or an alloy of said metal, or an alloy containing at least two metals in said group.

7. The integrated circuit device according to claim 1, further comprising:
   a pad provided in said uppermost wiring layer structure of said multi-layer wiring structure; and
   an opening formed in said insulation layer of said uppermost wiring layer structure to expose said pad.

8. The integrated circuit device according to claim 7, wherein said pad is provided at a part of said circuit excluding said temperature sensor section and said logic circuit section.

9. The integrated circuit device according to claim 1, wherein said plurality of wiring layer structures comprises said uppermost wiring layer structure and an intermediate wiring layer formed below said uppermost wiring layer structure, said intermediate wiring layer structure comprising at least two wires formed in said temperature sensor section and at least one wire formed in said logic circuit section.

10. The integrated circuit device according to claim 1, wherein said at least two wires formed in said intermediate wiring layer structure of said temperature sensor section are connected to said at least two wires formed in said uppermost wiring layer structure of said temperature sensor section through a via, and
   wherein said at least one wire formed in said uppermost wiring layer structure of said logic circuit section is connected to said at least one wire formed in said intermediate wiring layer structure of said logic circuit section through a via.

11. The integrated circuit device according to claim 1, wherein said single layer temperature monitor element covers a top surface and side surfaces of each of said at least two wires formed in said uppermost wiring layer structure of said temperature section.

12. The integrated circuit device according to claim 1, wherein said single layer temperature monitor element directly contacts said at least two wires formed in said uppermost wiring layer structure of said temperature sensor section.

13. The integrated circuit device according to claim 1, wherein at least one of said wires is connected to a ground potential wire and another of said wires is connected to a power source potential wire through a resistor.

14. The integrated circuit device according to claim 13, wherein a resistance of said resistor is approximately equally to a resistance of said single layer temperature monitor element.

15. The integrated circuit device according to claim 7, wherein said pad is formed of a material comprising Al.

16. The integrated circuit device according to claim 1, wherein said multi-layer wiring structure further comprises a lower-most layer comprising only an insulation layer.

17. The integrated circuit device according to claim 1, wherein a top surface and side surfaces of said single layer metal oxide temperature monitor element are planar.

18. The integrated circuit device according to claim 1, wherein said at least two wires each comprises a single layer.

19. The integrated circuit device according to claim 1, wherein the single layer temperature monitor element consists of the metal oxide.

20. The integrated circuit according to claim 1, wherein the single layer temperature monitor element comprises a single material throughout.

21. An integrated circuit device comprising:
a multi-layer wiring structure including a temperature sensor section and a logic circuit section, said multi-layer wiring structure comprising:
an upper-most wiring layer having at least two wires formed thereon in each of said temperature sensor section and said logic circuit section;
an intermediate wiring layer having at least one wire formed thereon in each of said temperature sensor section and said logic circuit section; and
a single layer metal oxide temperature monitor element directly contacting said at least one wire formed on said upper-most wiring layer in said temperature sensor section,
wherein said single layer metal oxide temperature monitor element completely covers said at least two wires,
wherein one of said at least two wires is connected to a ground potential wire and another of said at least two wires is connected to a power-source potential wire via a resistor,
wherein an output terminal is connected between said single layer temperature monitor element and said resistor, and
wherein a mechanism is provided for detecting a potential of said output terminal by applying a ground potential to said around wire and a power-source potential to said power-source potential wire.

* * * * *